(12) United States Patent
Asamura

(10) Patent No.: US 6,521,528 B1
(45) Date of Patent: Feb. 18, 2003

(54) SEMICONDUCTOR DEVICE AND METHOD OF MAKING THEREOF

(75) Inventor: Takeshi Asamura, Kanagawa-ken (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/696,227

(22) Filed: Oct. 26, 2000

Related U.S. Application Data

(62) Division of application No. 08/878,103, filed on Jun. 18, 1997, now Pat. No. 6,188,136.

(30) Foreign Application Priority Data

Jun. 26, 1996 (JP) .............................................. 8-165778

(51) Int. Cl.[7] .............................................. H01L 21/44
(52) U.S. Cl. ...................... 438/655; 438/592; 438/622; 438/648; 438/652; 438/651; 438/682
(58) Field of Search ................................ 438/584, 585, 438/586, 587, 588, 592, 597, 618, 621, 622, 623, 624, 637, 648, 649, 652, 655, 682, 683, 650, 651

(56) References Cited

U.S. PATENT DOCUMENTS

| 4,609,568 A | * | 9/1986 | Koh et al. .................. 438/365 |
| 4,617,723 A | | 10/1986 | Mukai |
| 4,786,611 A | * | 11/1988 | Pfiester ...................... 438/233 |
| 4,828,629 A | | 5/1989 | Ikeda et al. |
| 4,851,257 A | * | 7/1989 | Young et al. ................ 438/618 |
| 4,916,507 A | | 4/1990 | Boudou et al. |
| 5,223,456 A | * | 6/1993 | Malwah ....................... 438/586 |
| 5,416,352 A | | 5/1995 | Takada |
| 5,464,789 A | * | 11/1995 | Saito .......................... 438/217 |
| 5,633,523 A | | 5/1997 | Kato |
| 5,635,426 A | * | 6/1997 | Hayashi et al. ............. 438/453 |

FOREIGN PATENT DOCUMENTS

| JP | 60-38878 | 2/1985 |
| JP | 1-84663 | 3/1989 |

\* cited by examiner

*Primary Examiner*—Carl Whitehead, Jr.
*Assistant Examiner*—Maria Guerrero
(74) *Attorney, Agent, or Firm*—Finnegan, Henderson, Farabow, Garrett & Dunner, L.L.P.

(57) ABSTRACT

A semiconductor device includes a semiconductor substrate having a first and a second region, a first wiring layer including a lower layer having polycrystal silicon portions including impurities at a high concentration and formed over the first region of the semiconductor substrate via an insulating film. An upper layer of the first wiring layer is a metal silicide having a first film thickness. A second wiring layer includes a lower layer formed over the second region of the semiconductor substrate via an insulating film and is formed of either a non-doped polycrystal portion or a polycrystal silicon portion having a resistivity of at least 10 Ωcm. An upper layer of the second wiring layer is a metal silicide portion having a second film thickness thicker than the first film thickness.

9 Claims, 7 Drawing Sheets

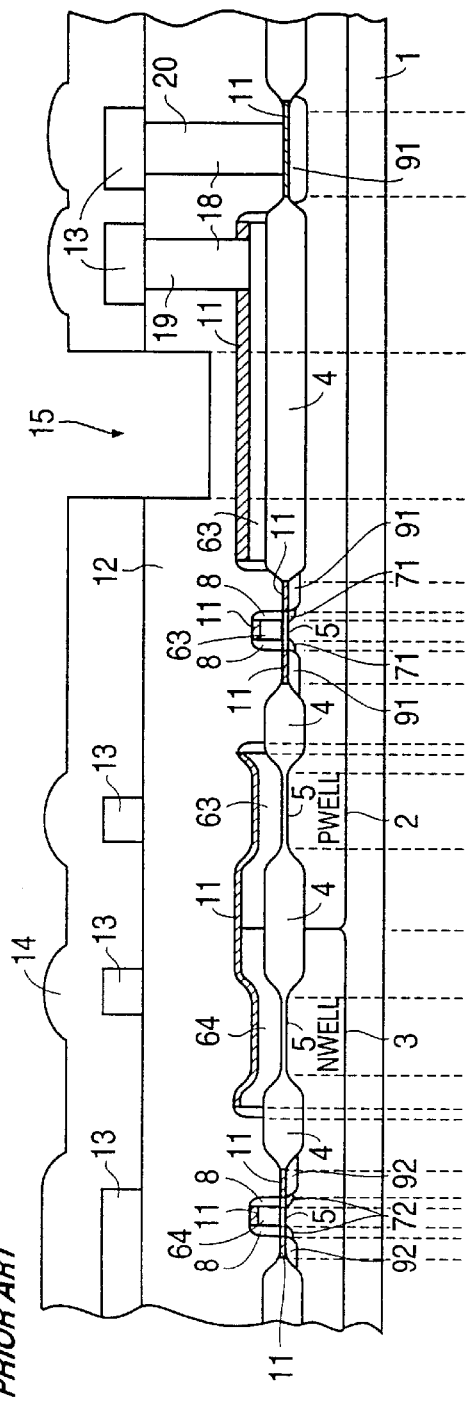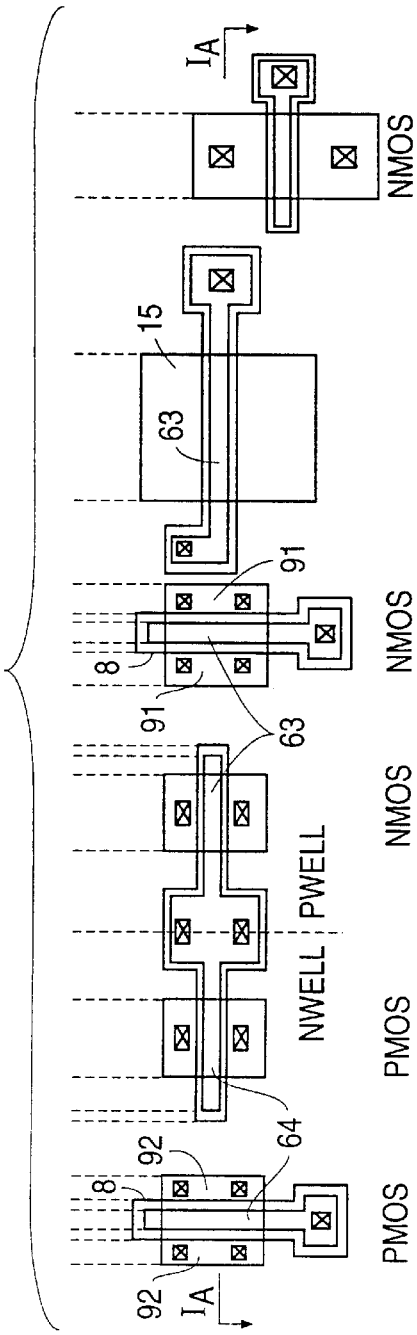
FIG. 1(a) PRIOR ART
FIG. 1(b) PRIOR ART

US 6,521,528 B1

SEMICONDUCTOR DEVICE AND METHOD OF MAKING THEREOF

This is a division of parent application Ser. No. 08/878,103, filed Jun. 18, 1997 now U.S. Pat. No. 6,88,136. The contents of this parent application being relied upon and incorporated by reference herein.

BACKGROUND OF THE INVENTION

1. Field of the Invention

The present invention relates to a structure of wirings or electrodes of a semiconductor device and a method of making thereof, and more particularly to a semiconductor device and a method of making thereof that accelerates the speed of a semiconductor device by reducing capacitances of wirings, and minimizes facilitating redundant process steps.

2. Description of the Related Art

Conventionally, polycrystal silicon including impurities in high concentration is used for a material of a gate electrode and wirings for connecting elements of a MOSFET constituting a semiconductor device. However, with the acceleration of the speed of a semiconductor device in recent years, a laminated structure of polycrystal silicon including impurities in high concentration and a metal having a low resistance and a high melting point or silicides thereof has been used more frequently than polycrystal silicon alone including impurities in high concentration.

FIGS. 1(a) and 1(b) illustrate a structure of a semiconductor device constituted by MOSFETs using the silicide technology.

FIG. 1(a) is a sectional view showing a semiconductor device manufactured by a conventional manufacturing method and FIG. 1(b) is a plan view of patterns of portions essential for facilitating understanding of the sectional view shown by FIG. 1(a). A section taken along a line $I_A$—$I_A$ of FIG. 1(b) corresponds to FIG. 1(a).

With reference to FIG. 1(a), the semiconductor device includes a P-type silicon substrate 1, a P-type well 2, an N-type well 3 and an element isolating insulating layer 4. Further, in an order from the left in FIG. 1(a), a single PMOS (P-type Metal Oxide Semiconductor), a PMOS and an NMOS (N-type Metal Oxide Semiconductor) constituting a CMOS (Complementary Metal Oxide Semiconductor) inverter in which a gate electrode is integrally formed by a local wiring on the element isolating insulating layer (hereinafter, well isolating insulating layer) 4 on a boundary between the P-type well 2 and the N-type well 3, a single NMOS, a redundancy cut portion 15, and a wiring on the element separating insulating layer 4 and single body of NMOS on a P-type well, are formed.

Source and drain regions, gate electrodes and the like are connected to aluminum wirings 13 on an inter-layer insulating film 12 through contact holes.

According to the conventional method of making a semiconductor device as illustrated, the P-type well 2 and the N-type well 3 are formed on the substrate 1. Then, the element isolating insulating layer 4 is formed on the surface of the wells 2 and 3 by the LOCOS (Local Oxidation of Silicon) process or the STI (Shallow Trench Isolation) process. Next, thin thermally-oxidized films 5 as gate oxide films and polycrystal silicon portions 63 and 64 are successively formed. Next, the polycrystal silicon portions 63 and 64 are patterned by using lithography technology whereby gate electrodes and wirings are formed.

Next, N-regions 71 and P-regions 72 having a shallow diffusion depth are formed by ion-implanting impurities respectively into regions of the NMOSFET and the PMOSFET for forming sources and drains with the gate electrodes and a resist mask, not illustrated, serving as masks. Next, silicon nitride is formed all over the face and side walls 8 are formed on side faces of the gate electrodes by anisotropically etching silicon nitride. Next, impurities are again ion-implanted into regions for forming the sources and the drains with the gate electrodes formed with the side walls 8 and a resist mask, not illustrated, serving as masks. As a result, N+ regions 91 (source, drain regions) and P+ regions 92 (source, drain regions) having a deep diffusion depth are formed. Here, N– and P– designate low impurity concentration and N+ and P+ designate high impurity concentration.

Next, the gate insulating film 5 on the source and drain regions 91 and 92 of the N-type and the P-type MOSFETs, are removed and the respective source and drain regions 91 and 92 are exposed. Next, a high-melting point metal, for example, a titanium and a titanium nitride are continuously accumulated all over the face by a sputtering process. Next, heat treatment is carried out by which silicide layers 11 are formed. Unreacted titanium and titanium nitride are removed by etching.

The technology of forming a suicide layer self-aligningly on the surface of exposed silicon is referred to as SALICIDE (Self Aligned Silicide) technology.

Next, the inter-layer insulating film 12 is accumulated and the surface is flattened by a CMP (Chemical-Mechanical Polishing) process. Next, areas other than the openings of the contact holes are covered by a resist, not illustrated, and an anisotropic etching is carried out whereby a contact hole 19 extending toward the wiring and a contact hole 20 extending toward the diffusion layer are simultaneously opened. Thereafter, a high-melting point metal 18 such as tungsten or the like is selectively formed only at the opening portions of the contact holes 19 and 20 by using a CVD (Chemical Vapor Deposition) process. Next, the aluminum wirings 13 and a passivation film 14 are formed and the semiconductor device is completed after a pad step.

When the semiconductor device to be manufactured includes a memory, after the pad step, an etching is carried out on the passivation film 14 and the inter-layer insulating film 12 to a degree to form a shallow portion of the inter-layer insulating film 12 so that the redundancy cut portion 15 may be provided on the wiring comprising the polycrystal silicon portions 63 and the silicide layer 11 as shown by FIG. 1(a).

According to the conventional method of making the MOSFET, in the step of ion-implanting the regions for forming sources and drains, the gate electrodes and the wirings on the P-type well 2 and the gate electrodes and the wirings on the N-type well 3, are simultaneously ion-implanted.

Therefore, high concentrations of impurities are introduced into the polycrystal silicon portions 63 and 64 constituting the gate electrodes and the wirings, with the result that the gate electrodes and the wirings are formed to have high conductivity.

However, the following problems are caused when high concentrations of impurities are introduced into all of the polycrystal silicon portions.

That is, the wirings having constituent elements of the polycrystal silicon portions 63 and 64 which are formed on the element isolating insulating layer 4 and where high concentrations of impurities have been introduced, constitute the MIS (Metal Insulator Semiconductor) capacitance with respect to the surface of the wells via the element isolating insulating layer 4. The MIS capacitance has a very large value since it is formed between the lower faces of the polycrystal silicon portions 63 and 64 and the surface of the P-type well 3 or the surface of the N-type well 4. As a result, the capacitance of wirings is increased whereby high speed operation of the semiconductor device is hampered.

Further, when a voltage is applied on the wirings having the constituents of the polycrystal silicon portions 63 and 64, an inversion layer is caused in the P-type well 2 or the N-type well 3 beneath the element isolating insulating layer 4, whereby the function of the isolating elements may be lost.

Accordingly, the threshold voltage in causing such an inversion layer must be sufficiently higher than the operational voltage of the semiconductor device.

That is, in order to secure the function of isolating elements, the impurity concentration of the P-type well 2 and the N-type well 3 must be higher. However, thereby, the source-drain coupling capacitances that are formed between the source and-the drain regions 91 and 92, and the P-type well 2 and the N-type well 3, are increased whereby high speed operation of the transistor is hampered.

Also, it is known that when high concentrations of impurities are introduced into polycrystal silicon, the formation of a silicide layer is hampered such that the formation of the silicide layer with a sufficient thickness becomes difficult. It is believed that impurities included in polycrystal silicon restrain a chemical reaction between polycrystal silicon and a high-melting point metal.

Therefore, even if the SALICIDE technology is used in the polycrystal silicon where high concentrations of impurities are introduced, the effect of reducing the sheet resistance of the wirings is restrained. Further, when design is advanced to achieve a finer structure and higher density of a semiconductor device and the width of wiring is narrowed, the effect of reducing the sheet resistance of wiring is further significantly restrained.

The sheet resistance is a resistance value per unit length in the unit wiring width which is used for evaluating the characteristic of wiring with Ω/square as a unit.

Also, N-type impurities are introduced into gate electrodes and wirings of a MOSFET formed on a P-type well and P-type impurities are introduced into gate electrodes and wirings of a MOSFET formed on an N-type well to control the threshold value of the formed MOSFET. As illustrated by FIGS. 1(a) and 1(b), the N+ polycrystal silicon portion 63 and the P+ polycrystal silicon portion 64 produce a portion where they are brought into contact with each other on the well isolating insulating layer 4. The contact portion is electrically connected by the silicide layer 11 laminated on the polycrystal silicon portions 63 and 64.

However, in thermal steps of the manufacturing process, the impurities are mutually diffused from the P+ polycrystal silicon portion 64 to the N+ polycrystal silicon portion 63, or from the N+ polycrystal silicon portion 63 to the P+ polycrystal silicon portion 64 via the upper layer of the silicide layer 11 or directly. Therefore, the impurities of opposite conductive types may enter the gate electrodes of the P-type MOSFET and the N-type MOSFET which are integrally formed with the wirings and the threshold voltages of the respective FETs are varied such that an operational failure may be caused.

By flattening the inter-layer insulating film 12, the depth of the contact hole 19 extending toward the wiring, becomes smaller than the depth of the contact hole 20 extending toward the diffusing layer 91 by the amount of a sum of the stepwise differences of a portion of the layer 4 formed by LOCOS and the thickness of the wirings. In that case, when the contact hole 19 extending toward the wiring and the contact hole 20 extending toward the diffusion layer are simultaneously opened by etching according to the RIE (Reactive Ion Etching) process, the contact hole 19 extending toward the wiring is over-etched by a difference in the depths of both contact holes. Furthermore, when the film thickness of the silicide layer 11 which becomes a stopper of etching, is thin, or when morphology (flatness) is not excellent, the margin of the etching stopper is small and, accordingly, a portion of the suicide layer 11 of the opening portion of the contact hole 19 extending toward the wiring is lost, as shown in FIG. 1(a).

Even if a high-melting point metal such as tungsten or the like is selectively made to grow by the CVD (Chemical Vapor Deposition) process at the opening portion of the contact hole where a portion or all of the silicide layer 11 is lost, a sufficiently low resistance value is not provided in respect of contact with the wiring formed at the upper layer such that contact failure is caused.

In order to solve the problem, the contact hole 19 extending toward the wiring and the contact hole 20 extending toward the diffusion layer must be opened separately. However, this results in an increase in the number of process steps since the contact holes are opened twice.

Further, when a semiconductor device to be manufactured includes a memory, a memory cell that fails to operate is isolated by cutting the redundancy cut portion 15 illustrated by FIGS. 1(a) and 1(b), with the result that the formed memory including the defect is relieved. The cutting is carried out by thermally cutting and separating the wiring constituted by the polycrystal silicon portion 63 and the suicide layer 11 on the element isolating insulating layer 4, by using a laser machine device.

However, when the cutting of wiring is incomplete, for example, only the silicide layer 11 is cut, the polycrystal silicon portion 63 including a high concentration of impurities which is formed as a portion of the wiring, remains. Since the polycrystal silicon portion 63 has high conductivity, the wiring remains electrically connected whereby the rate of isolating memory cells from the redundancy portion is reduced.

As described above, according to the conventional technology, the polycrystal silicon portion where high concentrations of impurities are introduced, is constituted as the wiring. Therefore, the capacitance thereof with respect to the well regions is increased. Further, to secure the isolation characteristic of the element isolating insulating layer, the impurity concentration of the well must be increased whereby the coupling capacitance of the source and drain is increased. The high speed operation of the semiconductor device is hampered by these capacitances.

Further, it is difficult to form the silicide layer with a sufficient film thickness on the polycrystal silicon portion where high concentrations of impurities are introduced. Therefore, the effect of reducing the sheet resistance is decreased by forming a structure laminated with the silicide layer and the effect becomes significant with a finer structure of the semiconductor device.

Also, the polycrystal silicon portion where the impurities of opposite conductive types are introduced, is used on the P-type well and the N-type well. Therefore, there is a portion where the P+ polycrystal silicon portion and the N+ polycrystal silicon portion are brought into contact with each other. Therefore, the impurities are diffused into each other at the contact portion whereby the threshold voltage of the FET is varied, causing operational failure.

The depths of the contact hole extending toward the wiring and the contact hole extending toward the substrate are different and the margin of opening the contact hole extending toward the wiring is small. Accordingly, contact failure is apt to result. Also, the number of process steps is increased if the process is modified to prevent the contact failure on the local wiring of the polycrystal silicon portion.

Further, when the semiconductor device is formed to include a memory, if the cutting of wiring constituted by the polycrystal silicon portion is incomplete, the rate of isolating memory cells from the redundancy portion is low since the conductance of polycrystal silicon is high.

It is an object of the present invention to provide a semiconductor device and a method of making thereof for overcoming the above-described problems.

SUMMARY OF THE INVENTION

Accordingly, the present invention is directed to a semiconductor device and method that substantially obviates one or more of the problems due to limitations and disadvantages of the related art.

In accordance with the present invention there is provided a semiconductor device comprising: a semiconductor substrate having a first and a second region; a first insulating film over the first region of the semiconductor substrate; a second insulating film over the second region of the semiconductor substrate; a first wiring layer having a lower layer formed over the first insulating film and constituted by polycrystal silicon including a high impurity concentration and an upper layer constituted by a metal silicide having a first film thickness; and a second wiring layer having a lower layer formed over the second insulating film and constituted by non-doped polycrystal silicon or polycrystal silicon having a resistivity of at least 10 ohm-cm and an upper layer constituted by the metal silicide having a second film thickness thicker than the first film thickness.

Also, in accordance with the present invention, there is provided a semiconductor device comprising: a semiconductor substrate having a first and a second region; a first insulating film over the first region of the semiconductor substrate; a second insulating film over the second region of the semiconductor substrate; a first wiring layer having a lower layer formed over the first insulating film and constituted by polycrystal silicon including a high impurity concentration and an upper layer including a metal having a high melting point; and a second wiring layer having a lower layer formed over the second insulating film and constituted by non-doped polycrystal silicon or polycrystal silicon having a resistivity of at least 10 ohm-cm and an upper layer including the metal having a high melting point.

Further, in accordance with the present invention, there is provided a semiconductor device comprising: a semiconductor substrate; an insulating film over the substrate; a polycrystal silicon portion over the insulating film; a metal layer comprising one of a high melting point metal or a metal silicide on the polycrystal silicon portion and forming with the polycrystal silicon portion a laminated structure constituting a wiring layer; and wherein the polycrystal silicon portion includes a selected portion which is non-doped or has a resistivity of at least 10 ohm-cm.

Also, in accordance with the present invention, there is provided a method of making a semiconductor device, comprising the steps of: forming an insulating film over a semiconductor substrate having a first and a second region; forming a polycrystal silicon portion that is either non-doped or with a resistivity of at least 10 ohm-cm on the insulating film over the first and second regions; forming a resist mask on the polycrystal silicon portion over the first region; introducing impurities only into the polycrystal silicon portion formed over the second region by using the resist mask; removing the resist mask; and forming a layer of a high melting point metal or a layer of a metal silicide on a surface of the polycrystal silicon portion formed over the first and second regions.

BRIEF DESCRIPTION OF THE DRAWINGS

FIGS. 1(a) and 1(b) are respectively a sectional view and a plan view of a conventional semiconductor device;

DETAILED DESCRIPTION OF THE PREFERRED EMBODIMENTS

Figure 2:
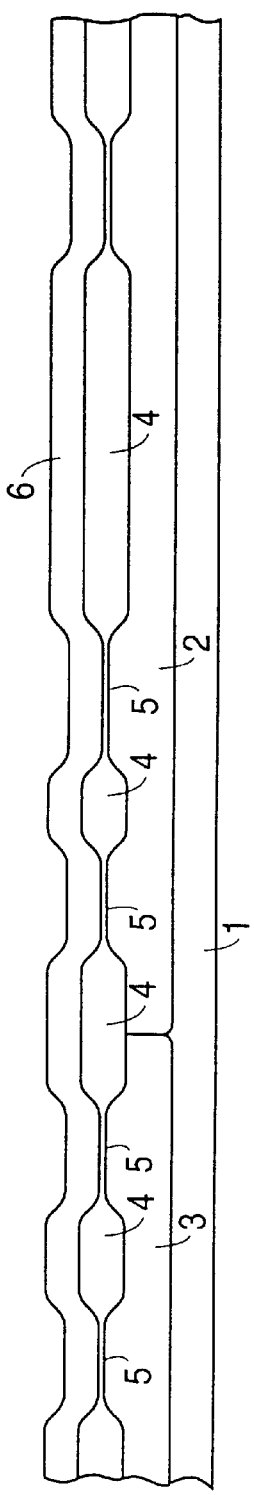
FIGS. 2–9 are sectional views showing a succession of steps for explaining a method of making a semiconductor device according to a first embodiment of the present invention.

A first embodiment of a semiconductor device and a method of making thereof are described with reference to FIGS. 2–9. Each of FIGS. 2–9 is a sectional view showing in an order from left in the drawing, a single PMOS on an N-type well, a PMOS and an NMOS constituting a CMOS inverter in which gate electrodes are integrally formed by a wiring on an element isolating insulating layer (hereinafter, particularly referred to as a well isolating insulating layer) on a boundary line between the P-type well and the N-type well, a single body of NMOS on a P-type well, a redundancy cut portion, a wiring on an element isolating insulating layer and a single body of NMOS on a P-type well.

With reference to FIG. 2 the P-type well 2 and the N-type well 3, each having an impurity concentration of $4\times10^{16}$cm$^{-3}$, are formed on the P-type silicon substrate 1 and the element isolating insulating layer 4 is formed thereon by the LOCOS process or the STI process. Successively, the thermally-oxidized film 5 having a film thickness of about 5–10 nm is formed as the gate oxide film in an oxygen environment of about 750° C. Next, a non-doped polycrystal silicon portion 6 including no impurities and having a film thickness of about 350 nm is formed by the CVD (Chemical Vapor Deposition) process using thermal decomposition of silane gas (SiH4) at about 620° C.

Figure 3:
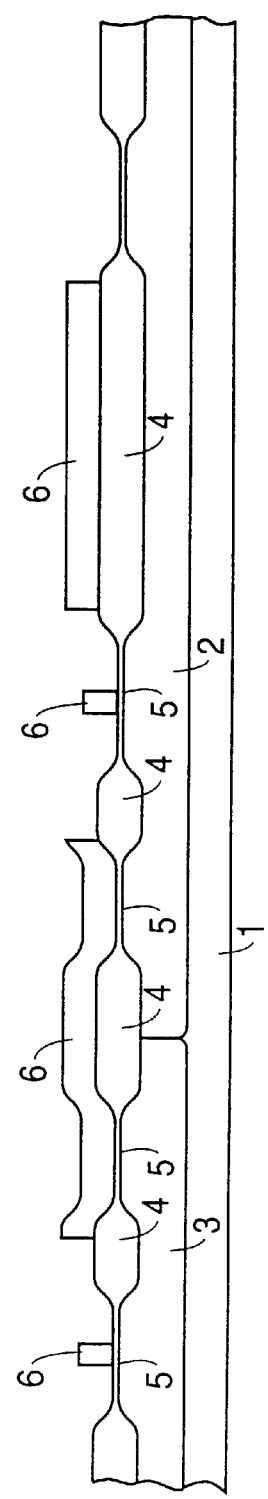

Next, with reference to FIG. 3, a resist, not illustrated, is formed all over the non-doped polycrystal silicon portion 6 and a resist mask is formed at regions for forming gate electrodes and wirings using lithography technology. Further, the non-doped polycrystal silicon portion 6 is patterned into shapes of the gate electrodes and the wirings by etching with the element separating insulating layer 4 and the thermally-oxidized film 5 as stoppers.

Figure 4:
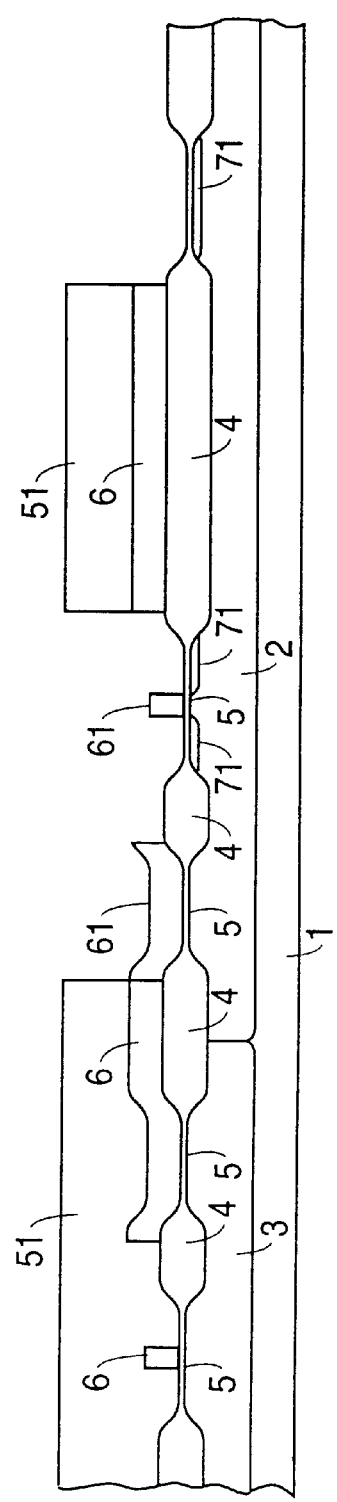

Next, as shown by FIG. 4, a resist is formed all over the substrate 1 and is patterned to form a resist mask 51, with the gate electrodes and the like formed on the P-type well 2 exposed. The polycrystal silicon portion on the gate insulating film at the open portion of the resist mask 51 is also formed as a gate electrode. Next, arsenic is ion-implanted under conditions of an acceleration energy of 50 keV and a dose amount of $3 \times 10^{14} cm^{-2}$ to self-aligningly form N-regions 71 having a shallow diffusion depth on the regions of the N-type MOSFET for forming sources and drains in the P-type well 2.

At this time, arsenic is simultaneously implanted on the gate electrode formed by the polycrystal silicon portion and exposed on the P-type well 2, to change non-doped polycrystal silicon portion 6 into an N-type polycrystal silicon portion 61. Further, the portion 6 corresponding to the gate electrode on the thermally oxidized film 5 and the portion 6 corresponding to the wiring on the element isolating insulating layer 4 on the N-type well 3 that are masked by the resist mask 51, are maintained in a non-doped state.

Figure 5:
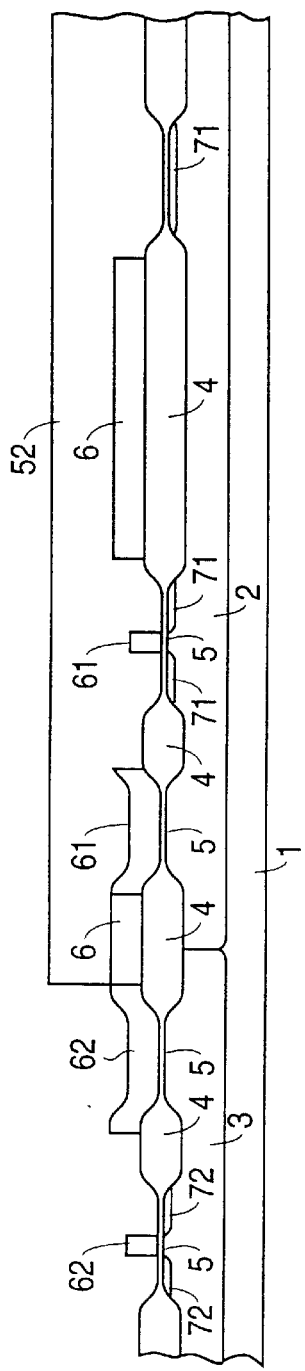

After removing the resist mask 51, as shown in FIG. 5, a resist is formed all over the substrate 1 and the resist is patterned to form a resist mask 52, with the gate electrode formed on the N-type well 3 exposed. The polycrystal silicon portion on the gate insulating film 5 on the left side of FIG. 5 at the open portion of the resist mask 52 is also formed as a gate electrode. Next, arsenic difluoride is ion-implanted under conditions of an acceleration energy of 45 keV and a dose amount of $2 \times 10^{14} cm^{-2}$ with the resist mask 52, the gate electrode and the element isolating insulating layer 4 and the like as masks. As a result, P-type regions 72 having a shallow diffusion depth are self-aligningly formed on regions of the P-type MOSFET for forming sources and drains at the N-type well 3.

At this time, arsenic difluoride is simultaneously implanted on the gate electrode formed by the polycrystal silicon portion exposed on the N-type well 3. As a result, the non-doped polycrystal silicon portion 6 is changed into a P-type polycrystal silicon portion 62. Also, portion 6 corresponding to the wiring on the element isolating insulating layer 4 that is masked by the resist mask 52, is maintained in a non-doped state.

Figure 6:
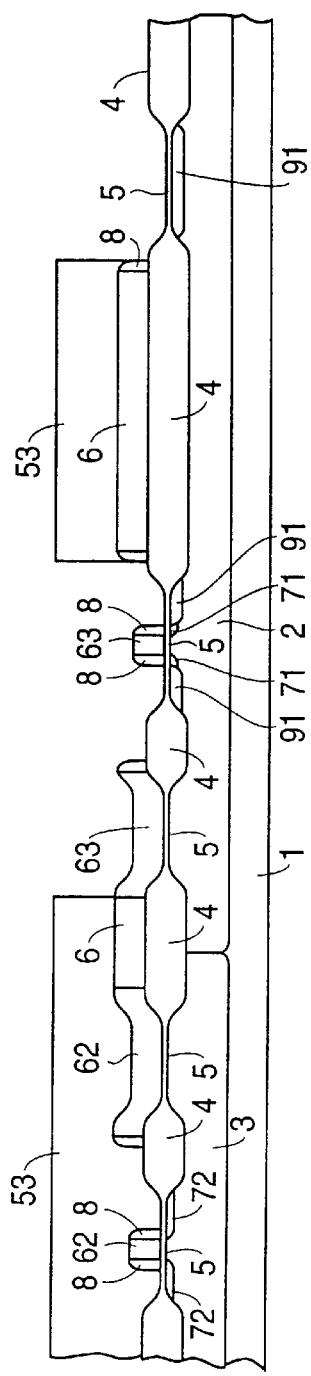

After removing the resist mask 52, as shown in FIG. 6, silicon nitride is accumulated all over the substrate 1 by the CVD process with raw materials of dichlorosilane ($SiH_2Cl_2$) and ammonia ($NH_3$) at about 780° C. Next, the silicon nitride is anisotropically etched by which side walls 8 having a width of about 100 nm are formed on side faces of each of the gate electrodes.

Next, a resist is formed all over the substrate 1 and the resist is patterned by which a resist mask 53 is formed. Next, arsenic is ion-implanted under conditions of an acceleration energy of 50 keV and a dose amount of $5 \times 10^{15} cm^{-2}$ with the resist mask 53, the gate electrode 61, the side walls 8, the element isolating insulating layer 4 and the like as masks. As a result, N+ regions (source, drain regions) 91 having a deep diffusion depth are self-aligningly formed at regions of the N-type MOSFET for forming sources and drains in the P-type well 2.

At this time, arsenic is simultaneously implanted on the gate electrode on the P-type well 2 by which arsenic is further implanted in addition to the implantation of arsenic at the previous step. As a result, the polycrystal silicon portion 61 is changed into an N+ polycrystal silicon portion 63 having a high impurity concentration. Further, the portion 6 corresponding to the wiring on the element isolating insulating layer 4 masked by the resist mask 53 is maintained in a non-doped state.

Figure 7:
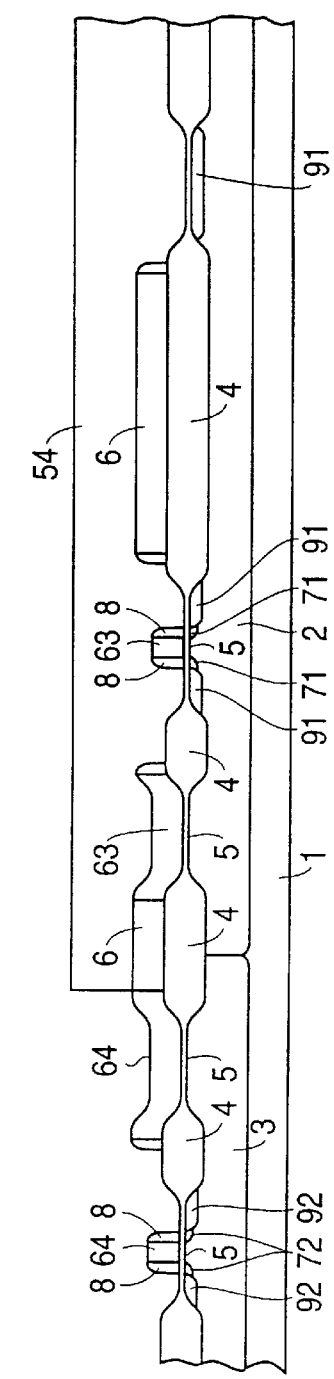

After removing the resist mask 53, as shown in FIG. 7, a resist is formed all over the substrate 1 and the resist is patterned by which a resist mask 54 is formed and the gate electrode formed on the N-type well is exposed. Next, boron is ion-implanted under conditions of an acceleration energy of 10 keV and a dose amount of $5 \times 10^{15} cm^{-2}$ with the resist mask 54, the gate electrode, the side walls 8, the element isolating insulating layer 4 and the like as masks. As a result, P+ regions(source, drain regions) 92 having a deep diffusion depth are self-aligning formed in the source and drain regions of the P-type MOSFET at the N-type well 3.

At this time, boron is simultaneously implanted on the gate electrode on the N-type well 3 and boron is further implanted in addition to the implantation of boron at the previous step. As a result, the polycrystal silicon portion 62 is changed into a P+ polycrystal silicon portion 64 having a high impurity concentration. Further, the portion 6 corresponding to the wiring on the element isolating insulating layer 4 masked by the resist mask 54 is maintained in a non-doped state.

An activating heat treatment of impurities implanted into the substrate, the gate electrodes and the wirings, is carried out under conditions of 1000° C. and 20 seconds by a lamp annealing process after implanting both ions.

Figure 8:
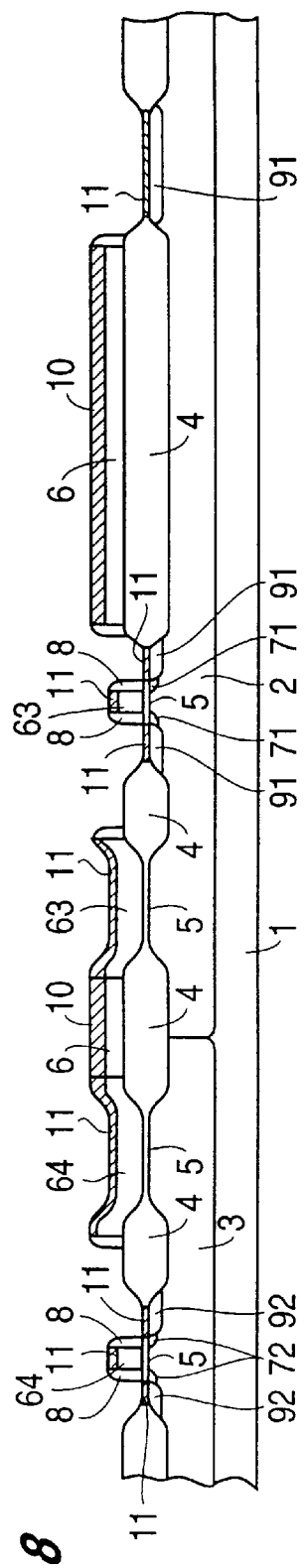

After removing the resist mask 54, as shown in FIG. 8, the gate insulating films 5 on the source and drain regions 91 and 92 of the N-type and the P-type MOSFETs, are removed and the respective source and drain regions 91 and 92 are exposed. Next, a high-melting point metal, for example, layers of titanium and a titanium nitride are successively applied all over the face of the device by the sputtering process. According to the first embodiment, the titanium layer is formed with a film thickness of about 20 nm and the titanium nitride layer is formed on top of the titanium layer with a film thickness of about 70 nm. Next, a heat treatment of 750° C. for 30 seconds is carried out by using a lamp annealing process by which silicide layers 10 and 11 are formed. Unreacted titanium and titanium nitride are removed by etching using a mixed solution of 1:1 of sulfuric acid and hydrogen peroxide. Next, optionally, the crystal of silicide is stabilized by carrying out a heat treatment at 850° C. for 20 seconds. By the silicide forming step, the silicide layers 10 and 11 are formed on the surfaces of the source and drain regions 91 and 92, the exposed portions on the upper faces of the gate electrodes 63 and 64 and the surface of the wiring 6 comprising non-doped polycrystal silicon. The film thicknesses of the formed silicide layers 10 and 11 are about 50 nm on the non-doped polycrystal silicon portion and about 30 nm on the other portions.

Figure 9:
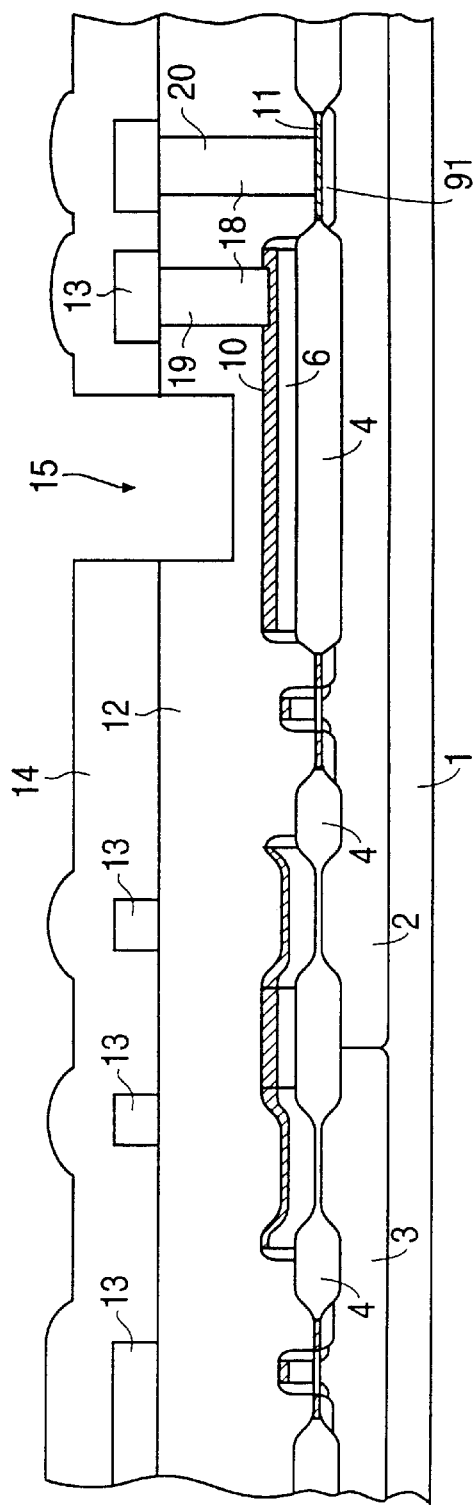

Next, as shown in FIG. 9, the inter-layer insulating film 12 is accumulated by the CVD process. Then, the film 12 is flattened by the CMP process and portions other than the opening portions of contact holes 18 and 19 are covered by a resist, not illustrated. Next, the contact hole 19 extending toward the wiring and the contact hole 20 extending toward the diffusion layer are simultaneously opened by anisotropic etching. The etching of the contact hole 19 is stopped by the silicide layer 10. Next, a high-melting point metal 18 such as tungsten or the like is selectively formed at about 250° C. in both contact holes 19 and 20 by a CVD process using tungsten hexafluoride and silane gas. Next, aluminum wirings 13 and a passivation film 14 are formed whereby a semiconductor device according to the first embodiment of the present invention is completed after a pad step.

When the manufactured semiconductor device includes a memory, the redundancy cut portion 15 may be formed by etching the passivation film 14 and the inter-layer insulating film 12 to a degree such that a thin layer of the inter-layer insulating film 12 remains, by using a resist mask, not illustrated, after the pad step.

Further, according to the steps explained in reference to FIG. 4 and FIG. 5 in the first embodiment, the resist masks 51 and 52 are formed to cover all of the polycrystal silicon portion 6 formed on the element isolating insulating layer 4. However, all of the polycrystal silicon portion 6 formed on the element isolating insulating layer 4 is not necessarily formed as explained above if the suicide layer 10 formed on the upper layer can be formed with a sufficient film thickness. Since the concentration of ions is low in the ion implantation carried out in these steps, the polycrystal silicon portion 6 may be sufficiently lightly doped to enable formation thereon of the silicide layer 10 with sufficient thickness. In this case, the sheet resistivity of the polycrystal silicon portion 6 formed on the element isolating insulating layer 4 may preferably be 10 Ωcm or more.

Further, the steps explained in reference to FIG. 4 and FIG. 5 in the first embodiment are steps of forming the LDD (Lightly Doped Drain) region of a transistor. However, in the steps of making a transistor where the LDD region is not formed, the steps may be omitted.

According to the first embodiment of the present invention as described above, the following effects are achieved in comparison with the conventional semiconductor device and the method of making thereof.

Non-doped polycrystal silicon is provided with a very high resistivity and can be regarded as substantially an insulator. Accordingly, in wiring operation, non-doped polycrystal silicon may be regarded electrically as a dielectric layer for forming the capacitance between the silicide layer and the P-type well 2 or N-type well 3 along with the element separating insulating layer 4. Therefore, the MIS capacitance caused at the wiring and the substrate can be decreased by the amount of the film thickness of non-doped polycrystal silicon in comparison with the case in which the conventional polycrystal silicon portion having high impurity concentration is used.

Further, when non-doped polycrystal silicon is used, the MIS capacitance is decreased and the threshold voltage for forming the MIS inversion layer is increased. Accordingly, the isolating function of the element isolating insulating layer 4 is enhanced. Therefore, element isolation can sufficiently be carried out even with a low concentration of a well, and the source-drain coupling capacitance of a MOSFET is decreased.

Therefore, the MIS capacitance can be decreased and the source-drain coupling capacitance can be decreased by which high-speed operation of the semiconductor device is achieved.

Further, the sheet resistance of the wiring formed by the polycrystal silicon portion and the silicide layer may be regarded as a single value in the case where the sheet resistance of the silicide layer and the sheet resistance of the polycrystal silicon portion are connected in parallel. The sheet resistance of the silicide layer is 50 to 100 times smaller than the sheet resistance of the polycrystal silicon portion where a large amount of impurities are added. Therefore, the sheet resistance of the wiring is mainly governed by the sheet resistance of the silicide layer.

According to the first embodiment of the present invention, the silicide layer 10 produced by the reaction with the non-doped polycrystal silicon portion 6 and the silicide layer 11 produced by the reaction with the polycrystal silicon portions 63 and 64 including high concentration of impurities as in the conventional case, are formed. Impurities for restraining the silicide formation are not present in the polycrystal silicon portion 6 and accordingly, the silicide layer 10 formed on the non-doped polycrystal silicon portion 6 can be made to grow thick and flat. Therefore, even if the resistivity of the non-doped polycrystal silicon portion 6 constituting the wiring is very high, a sufficient conductivity can be provided as wiring by the silicide layer 10. Accordingly, the sheet resistance of the wiring using non-doped polycrystal silicon is lower than the sheet resistance of the wiring using polycrystal silicon including high concentration of impurity, because the silicide layer 10 can be grown thicker than layers 11.

Also, according to the conventional case, if the fine structure and high density of a semiconductor device is developed and the width of wiring or the like is narrowed, even if the silicide layer is formed on a polycrystal silicon portion where high concentration of impurities are included, the effect of reducing the sheet resistance of wiring due to the silicide layer is constrained. However, in accordance with the present invention, because the thick silicide layer 10 can be formed on the non-doped polycrystal silicon layer 6, there is no constraint on the ability to form a fine structure, and a silicide layer having a sufficient film thickness can be formed irrespective of the width of wiring or the like.

Further, according to the present invention, non-doped polycrystal silicon is necessarily present between the wirings comprising N+ polycrystal silicon and P+ polycrystal silicon. Therefore, during thermal steps in the manufacturing process, direct mutual diffusion of impurities from N+ to P+ or P+ to N+, or diffusion of impurities via the suicide layer can be prevented. In the first embodiment, this diffusion is prevented by the presence of the non-doped polycrystal silicon layer 6 between the N+ polycrystal silicon portion 63 and the N+ polycrystal silicon portion 64. Accordingly, operational failure caused by introducing impurities of opposite conductive types to the gate electrodes of the MOSFET can be prevented.

Further, in the steps of connecting the wiring and the diffusing layer to the upper aluminum wirings 13, in order to flatten the inter-layer insulating layer 12, the depth of the contact hole 19 extending toward the local wiring of the polycrystal silicon portion, is smaller than the depth of the contact hole 20 extending toward the diffusing layer by the value of a sum of the film thickness of a portion of the element isolating insulating layer 4 and the film thickness of the wiring. Here, if the contact hole 19 extending toward the wiring and the contact hole 20 extending toward the diffusing layer are simultaneously opened by the RIE process, the opening of the contact hole extending toward the local wiring is over-etched by a difference in depths of both contact hole. However, with regard to the film thickness of the silicide layer operating as a stopper of etching, the thickness of the silicide layer 10 formed on the non-doped polycrystal silicon portion 6 is greater than that of the silicide layer 11 formed on the polycrystal silicon portions 63 and 64 where high concentration of impurities are introduced. Also, the morphology (flatness) of titanium silicide is excellent. Therefore, the silicide layer 10 at the opening portion of the contact hole 19 extending toward the local wiring is not lost by over-etching as in the conventional case.

When the high-melting point metal 18 is selectively made to grow by the CVD process at the opening portion of the contact hole 19 where the silicide layer 10 remains, excellent electrical contact is made with the wiring. Further, the number of process steps is reduced compared with that of the conventional process in which the contact hole 19 extending toward the wiring and the contact hole 20 extending toward the diffusing layer are separately opened.

Also, in the step of cutting the redundancy portion of a memory by using a laser machining device, only the titanium silicide layer needs to be cut and remaining polycrystal silicon layer 6 in a non-doped state need not be cut. The polycrystal silicon layer 6 at the lower layer can remain uncut, since it acts as an insulating layer. Therefore, the memory is effectively electrically disconnected by which the rate of relieving the redundancy portion can be improved.

A semiconductor device and a method of making thereof according to a second embodiment of the present invention are described next with reference to FIGS. 10–18. FIGS. 10–18 are sectional views indicating in an order from left to right in the drawings, a single body of PMOS on an N-type well, a PMOS and an NMOS constituting a CMOS inverter in which a gate electrode is integrally formed by a wiring on a well isolating insulating layer on a boundary between a P-type well and an N-type well, a single body of NMOS on a P-type well, a redundancy cut portion, a wiring on an element isolating insulating layer and an area forming a single body of NMOS on a P-type well, similar to those in the first embodiment. Further, points which are not particularly referred to are similar to those described in the first embodiment.

Figure 10:
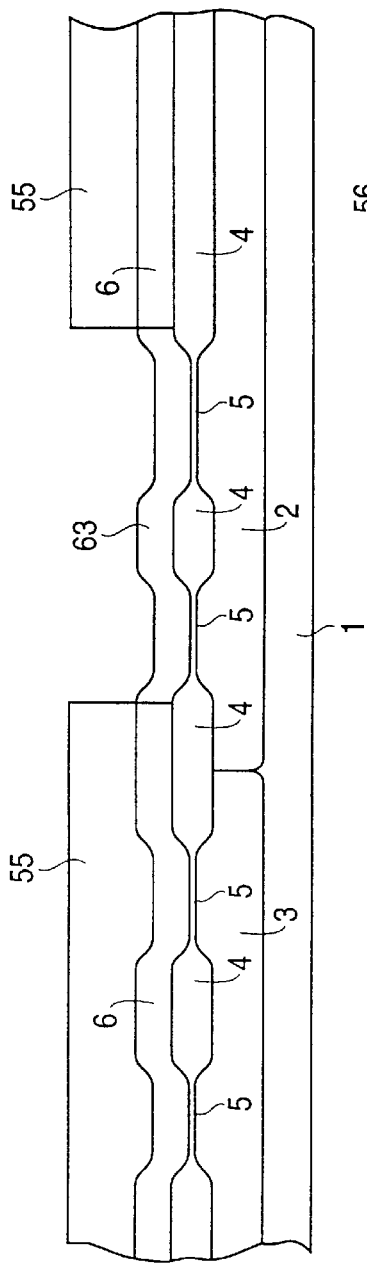
FIGS. 10–18 are sectional views showing a succession of steps for explaining a method of making a semiconductor device according to a second embodiment of the present invention.

First, as illustrated by FIG. 10 a P-type well 2, an N-type well 3 and an element isolating insulating layer 4 are formed on a P-type silicon substrate 1. Next, a thermally-oxidized film 5 is formed on the surface of the P-type well 2 and the N-type well 3. Next, a non-doped polycrystal silicon portion 6 is accumulated with a film thickness of about 350 nm on the element isolating insulating film 4 and the thermally-oxidized film 5 by a CVD process. Next, a resist is formed all over the polycrystal silicon layer 6 and the resist is patterned to form a resist mask 55. Next, phosphor is ion-implanted under conditions of an acceleration energy of 40 keV and a dose amount of $1 \times 10^{16} cm^{-2}$ by which a portion of the non-doped polycrystal silicon 6 is changed into an N+ polycrystal silicon portion 63. At this time, the polycrystal silicon portion 6 that is masked by the resist mask 55 is maintained in a non-doped state.

Figure 11:
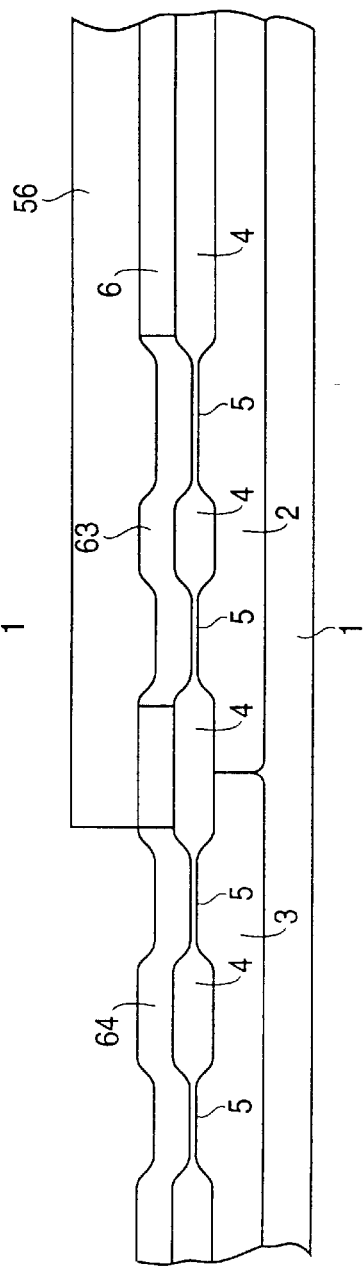

After removing the resist mask 55, as shown in FIG. 11, a resist is formed all over the polycrystal silicon portion 6 and the resist is patterned to form a resist mask 56. Next, boron is ion-implanted under conditions of an acceleration energy of 15 keV and a dose amount of $7 \times 10^{15} cm^{-2}$ with the resist mask 56 as the mask by which the non-doped polycrystal silicon 6 is changed into a P+ polycrystal silicon portion 64. At this time the polycrystal silicon portion 6 that is masked by the resist mask 56 is maintained in a non-doped state.

Figure 12:
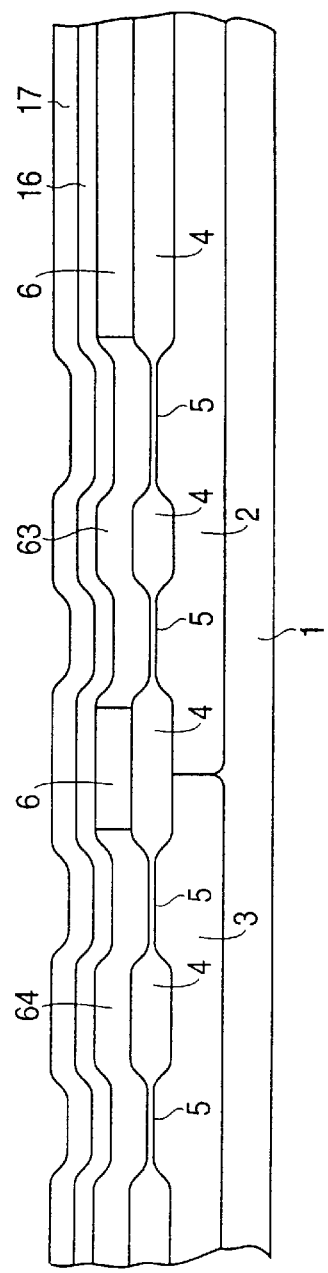

After removing the resist mask 56, a heat treatment is carried out at 800° C. for about 30 minutes to diffuse the introduced impurities. Successively, as shown in FIG. 12, a high-melting point metal 16, for example, a tungsten layer having a film thickness of about 100 nm is accumulated all over the face by a sputtering process. Successively, a silicon nitride film 17 having a film thickness of about 100 nm is accumulated by a CVD process using cyclosilane and ammonia.

Figure 13:
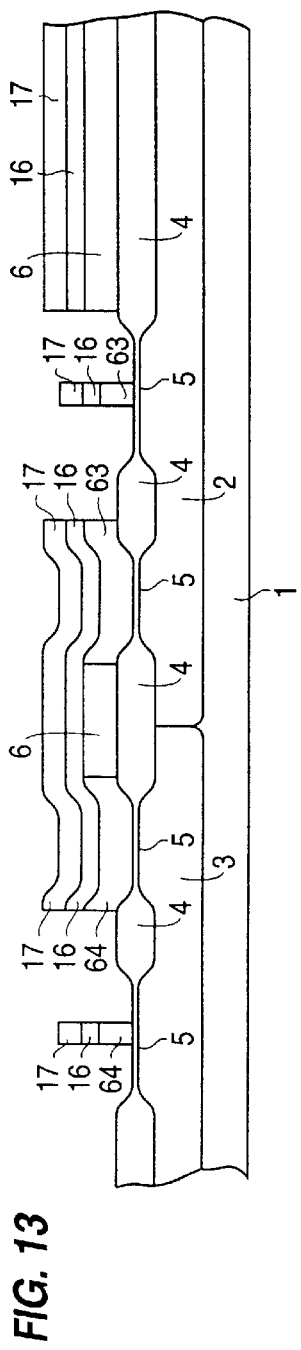

Next, as illustrated in FIG. 13, the nitride film 17, the high-melting point metal 16 and the N+ and P+ polycrystal silicon portions 63 and 64 and the non-doped polycrystal silicon portion 6, are selectively patterned into shapes of gate electrodes and wirings with a resist, not illustrated, as a mask and the element isolating insulating layer 4 and the thermally-oxidized film 5 on the substrate as etching stoppers.

Figure 14:
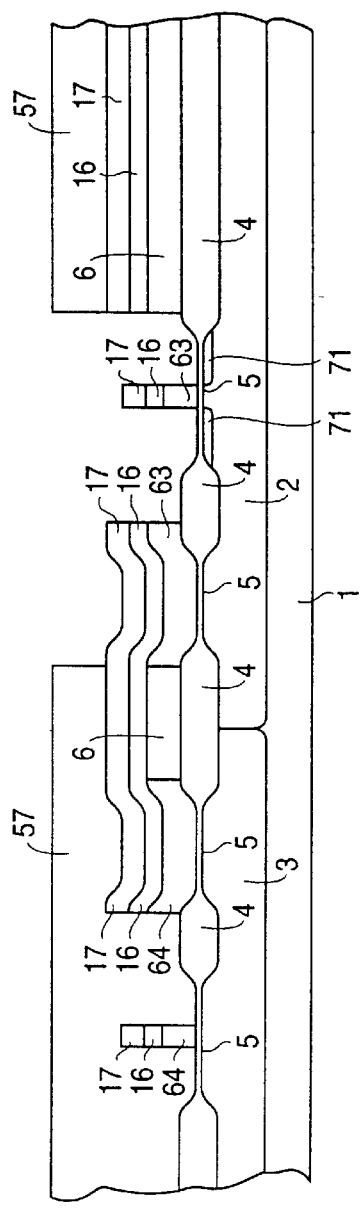

Next, as shown in FIG. 14, a resist is formed all over the face and the resist is patterned by which a resist mask 57 is formed and a gate electrode formed on the P-type well 2 is exposed. Next, arsenic is ion-implanted on the exposed portion of the substrate under conditions of an acceleration energy of 50 keV and a dose amount of $3 \times 10^{14} cm^{-2}$ with the resist mask 57, the gate electrode, the element isolating insulating layer 4 and the like as masks. Thereby, N-regions 71 having a shallow diffusion depth are self-aligningly formed at areas of the N-type MOSFET for forming the source and drain of the N-type MOSFET in the P-type well 2.

Figure 15:
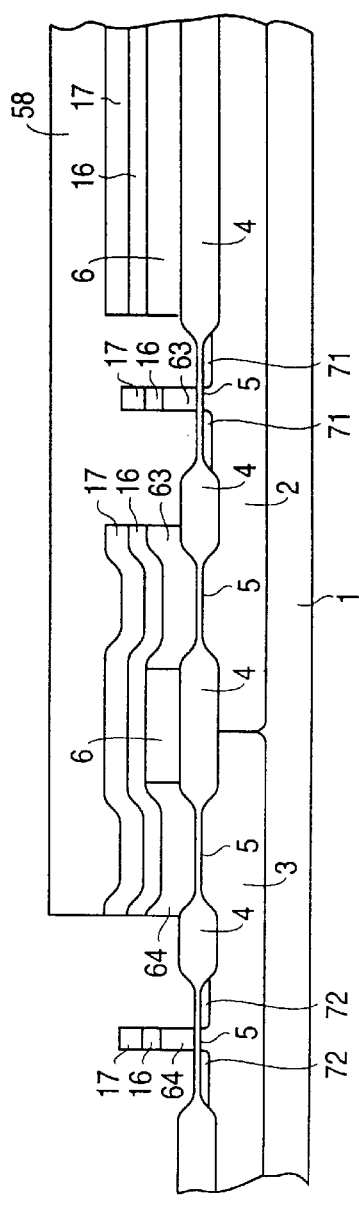

After removing the resist mask 57, as shown in FIG. 15, a resist is formed all over the face and the resist is patterned by which a resist mask 58 is formed and the gate electrode formed on the N-type well 3 is exposed. Next, boron ii difluoride is ion-implanted under conditions of an acceleration energy of 45 keV and a dose amount of $2 \times 10^{14} cm^{-2}$ to the exposed portion of the substrate with the resist mask 58, the gate electrode, the element isolating insulating layer 4 and the like as masks. Thereby, P-regions 72 having a shallow diffusion depth are self-aligningly formed at the regions for forming the source and drain of the P-type MOSFET in the N-type well 3.

Figure 16:
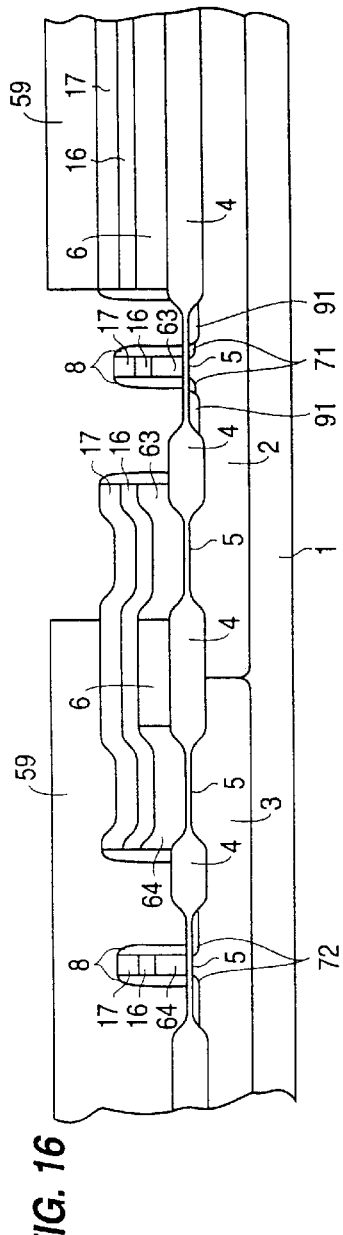

After removing the resist mask 58, as shown in FIG. 16, a silicon nitride layer is accumulated all over the face by a CVD process and is anisotropically etched by which side walls 8 having a width of about 100 nm are formed on side faces of the gate electrode. Next, a resist is formed all over the substrate 1 and the resist is patterned by which the resist mask 59 is formed and the gate electrode formed on the P-type well 2 is exposed. Next, arsenic is ion-implanted under conditions of an acceleration energy of 50 keV and a dose amount of $3 \times 10^{14} cm^{-2}$ with the resist mask 59, the gate electrode, the element isolation insulating layer 4 and the like as masks by which N+ regions(source, drain regions) 91 having a deep diffusion depth are self-aligningly formed at regions for forming the source and drain of the N-type MOSFET in the P-type well 2.

Figure 17:
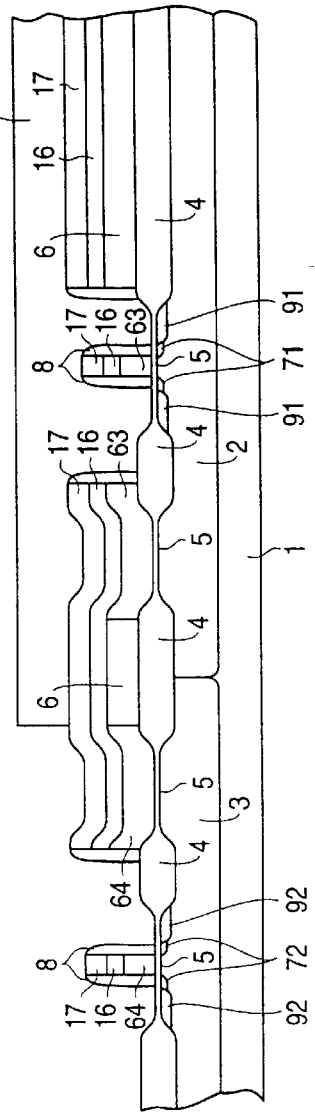

After removing the resist mask 59, as shown in FIG. 17, a resist is formed all over the substrate 1 and the resist is patterned by which a resist mask 60 is formed and the gate electrode formed on the N-type well 3 is exposed. Next, boron is ion-implanted under conditions of an acceleration energy of 10 keV and a dose amount of $5 \times 10^{15} cm^{-2}$ with the resist mask 60, the gate electrode, the element isolating insulating layer 4 and the like as masks by which P+regions (source, drain regions) 92 having a deep diffusion depth are self-aligningly formed at the regions for forming the source and the drain of the P-type MOSFET in the N-type well 3.

With regard to the step of implanting ions self-aligningly to the regions of the sources and drains of the N-type and the P-type MOSFETs, the portion for forming non-doped polycrystal silicon is covered by the resist masks similar to the first embodiment. However, according to the second embodiment, the non-doped polycrystal silicon portion is covered by the high-melting point metal film 16 and the nitride film 17. The high-melting point metal film 16 and the nitride film 17 provide sufficient masking during the ion implantation, so that a resist mask may not be necessary on the non-doped polycrystal silicon portion in the steps of ion implantation.

Figure 18:
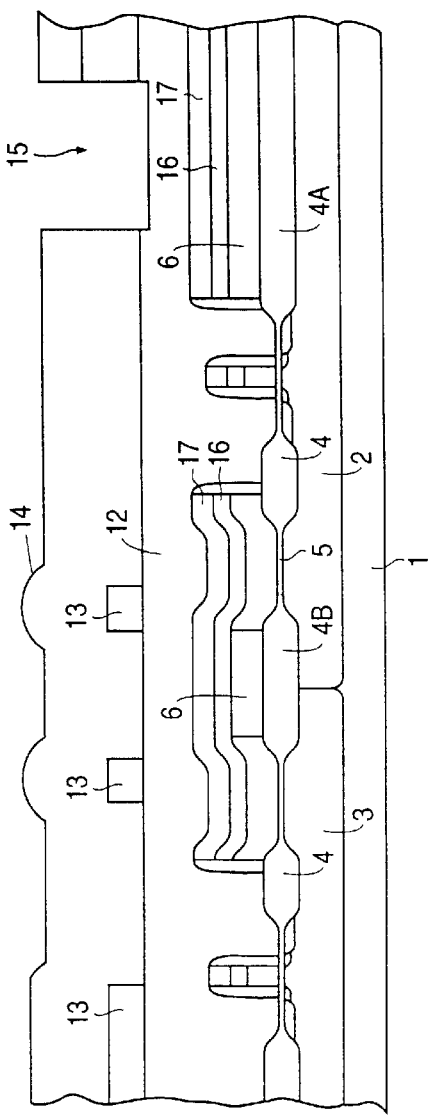

Next, as shown in FIG. 18, an inter-layer insulating film 12 is accumulated by the CVD process and flattened by the CMP process. Contact holes, not illustrated, are opened, aluminum wirings 13 and a passivation film 14 are formed and the semiconductor device according to the second embodiment of the present invention is completed after a pad step.

When the manufactured semiconductor device includes a memory, after the pad step, the passivation film 14 and the inter-layer insulating film 12 are etched to a degree such that a thin inter-layer insulating film 12 remains, by using a resist mask, not illustrated, by which a redundancy out portion 15 may be provided.

Further, the steps explained in reference to FIG. 14 and FIG. 15 of the second embodiment are steps for forming LDD (Lightly Doped Drain) regions of a transistor. However, the steps may be omitted in steps of making a transistor where the LDD region is not formed.

According to the second embodiment of the present invention as described above, an effect similar to that in the first embodiment explained above is provided. Further, according to the second embodiment, the polycrystal silicon portion 6 that is formed as the wiring on the element isolation insulating layer 4A and the wall isolation insulating layer 4B, is masked by the resist (or a nitride film and a high-melting point metal when the resist is not present) in the steps of implanting ions for forming the sources and the drains. Therefore, the second embodiment is characterized in that no impurities are included in the polycrystal silicon portion 6 and the sheet resistance of the wiring is controlled by the sheet resistance of the tungsten layer 16 formed thereabove.

Further, according to the second embodiment, different from the first embodiment, the high-melting point metal such as tungsten or the like is accumulated above the polycrystal silicon portion by using a sputtering process. That is, according to the second embodiment the silicide layer of the first embodiment is not formed. Therefore, the film thickness of the high-melting point metal that is formed at the upper layer remains constant irrespective of the amount of impurities in the polycrystal silicon portion at the underlayer. Generally, the high-melting point metal such as tungsten or the like is provided with a sheet resistance that is lower than that of the silicide layer and, therefore, the sheet resistance of the wiring including non-doped polycrystal silicon can sufficiently be reduced. Further, the high-melting point metal portion having uniform film thickness can be formed as the wiring and, accordingly, the sheet resistance of the wiring can accurately be formed.

The present invention is not limited to the first and the second embodiments. For example, the metal silicide formed on the non-doped polycrystal silicon portion in the first embodiment can be provided as a compound other than titanium silicide, for example, cobalt silicide, nickel silicide, zirconium silicide, molybdenum silicide, palladium silicide, vanadium silicide, platinum silicide and the like.

Further, the high-melting point metal formed on the non-doped polycrystal silicon portion in the second embodiment may be provided as a metal other than tungsten, such as zirconium, titanium or the like, or a layer laminated with these metals.

It will be apparent to those skilled in the art that various modifications and variations can be made to the semiconductor device and method of the present invention without departing from the spirit or scope of the invention. Thus, it is intended that the present invention cover the modifications and variations of this invention provided they come within the scope of the appended claims and their equivalents.

What is claimed is:

1. A method of making a semiconductor device comprising the steps of:

forming an insulating film over a semiconductor substrate having a first and a second region;

forming a polycrystal silicon portion that is either non-doped or with a resistivity of at least 10 Ωcm on the insulating film over the first and the second regions;

forming a resist mask on the polycrystal silicon portion located over the first region;

introducing impurities only into the polycrystal silicon portion located over the second region by using the resist mask;

removing the resist mask; and forming a layer of a high melting point metal or a layer of a metal silicide on a surface of the polycrystal silicon portion located over the first and second regions;

wherein the high melting point metal layer or metal silicide layer formed on the surface of the polycrystal portion located over the first region is greater in thickness than the high melting point metal layer or metal silicide layer formed on the surface of the polycrystal portion over the second region.

2. The method of making a semiconductor device according to claim 1, including the step of defining the first region and the second region to be contiguous with each other.

3. The method of making a semiconductor device according to claim 1, wherein the insulating film forming step includes the step of forming the insulating film over the second region as an inter-element isolating insulating layer.

4. The method of making a semiconductor device according to claim 1, further including a step of forming a redundancy cut portion in the second region of the semiconductor substrate.

5. The method of making a semiconductor device according to claim 1, further including a step of forming contact holes that access the layer of the metal having a high melting point or the layer of the metal suicide formed over the second region.

6. The method of making a semiconductor device according to claim 1, further comprising the steps of:

forming an inter-layer insulating film over the semiconductor substrate; and opening simultaneously a first contact hole reaching the high melting point metal layer or the metal silicide layer and a second contact hole reaching the semiconductor substrate.

7. The method of making a semiconductor device according to claim 1, wherein the step of forming the metal silicide layer includes a step of forming the metal silicide layer of one of titanium sulicide, cobalt silicide, nickel silicide, zirconium silicide, molybdenum silicide, palladium silicide, vanadium silicide and platinum silicide.

8. The method of making a semiconductor device according to claim 1, wherein the step of forming a high melting point metal layer includes a step of forming the high melting point metal layer of one of tungsten, zirconium and titanium.

9. A method of making a semiconductor device comprising the steps of:

forming an insulating film over a semiconductor substrate having a first and a second region;

forming a polycrystal silicon portion that is either non-doped or with a resistivity of at least 10 Ωcm on the insulating film;

introducing impurities into the polycrystal silicon portion located only over the first region; and;

forming a layer of a metal or a layer of a metal silicide on a surface of the polycrystal silicon portion located over the first region and the second region;

wherein the metal layer or metal silicide layer formed on the surface of the polycrystal portion located over the first region is greater in thickness than the metal layer or metal silicide layer formed on the surface of the polycrystal portion over the second region.

* * * * *

UNITED STATES PATENT AND TRADEMARK OFFICE
CERTIFICATE OF CORRECTION

PATENT NO.    : 6,521,528 B1
DATED         : February 18, 2003
INVENTOR(S)   : Asamura It is certified that error appears in the above-identified patent and that said Letters Patent is hereby corrected as shown below:

Column 14,
Line 57, change "suicide" to -- silicide --.

Column 15,
Line 4, change "sulicide" to -- silicide --.

Signed and Sealed this

Twenty-second Day of April, 2003

JAMES E. ROGAN
*Director of the United States Patent and Trademark Office*